(12) United States Patent
Wang

(10) Patent No.: US 11,047,942 B2
(45) Date of Patent: Jun. 29, 2021

(54) MAGNETIC RESONANCE IMAGING METHOD AND SYSTEM WITH OPTIMAL VARIABLE FLIP ANGLES

(71) Applicant: UNIVERSITY OF CINCINNATI, Cincinnati, OH (US)

(72) Inventor: Jinghua Wang, Mason, OH (US)

(73) Assignee: UNIVERSITY OF CINCINNATI, Cincinnati, OH (US)

(\*) Notice: Subject to any disclaimer, the term of this patent is extended or adjusted under 35 U.S.C. 154(b) by 0 days.

(21) Appl. No.: 16/758,465

(22) PCT Filed: Oct. 23, 2018

(86) PCT No.: PCT/US2018/057007
§ 371 (c)(1),
(2) Date: Apr. 23, 2020

(87) PCT Pub. No.: WO2019/083936
PCT Pub. Date: May 2, 2019

(65) Prior Publication Data
US 2020/0256939 A1    Aug. 13, 2020

Related U.S. Application Data

(60) Provisional application No. 62/576,226, filed on Oct. 24, 2017.

(51) Int. Cl.
*G01R 33/48* (2006.01)
*G01R 33/54* (2006.01)
(Continued)

(52) U.S. Cl.
CPC ....... *G01R 33/4822* (2013.01); *G01R 33/543* (2013.01); *G01R 33/5608* (2013.01); *G01R 33/5617* (2013.01)

(58) Field of Classification Search
CPC .............. G01R 33/4822; G01R 33/543; G01R 33/5608; G01R 33/5617; G01R 33/482;
(Continued)

(56) References Cited

U.S. PATENT DOCUMENTS 10,324,153 B2 \* 6/2019 Li ........................... A61B 5/055
10,444,311 B2 \* 10/2019 Wang ................... A61B 5/0042
(Continued)

FOREIGN PATENT DOCUMENTS

WO      2016145335 A1    9/2016

*Primary Examiner* — Susan S Lee
(74) *Attorney, Agent, or Firm* — Dinsmore & Shohl LLP

(57) ABSTRACT

A method and system for improving the quality of MR images acquired with optimal variable flip angles includes receiving MRI parameters for a target tissue, selecting at least one objective function from a plurality of objective functions, simulating a relationship between each flip angle and the at least one objective functions based on the MRI parameters, determining optimal variable flip angle distribution to reach optimization of the at least one objective function for whole acquisition of the MR image, selecting or optimizing a k-space strategy, applying a plurality of radio frequency (RF) pulses with the optimal variable flip angle distribution and the k-space strategy to a target area in an object, receiving MR signals from the target area, the MR signals corresponding to the plurality of RF pulses, acquiring, in the k-space strategy, k-space lines based on the MR signals, and reconstructing the MR image from the k-space lines.

20 Claims, 10 Drawing Sheets

(51) Int. Cl.
*G01R 33/56* (2006.01)
*G01R 33/561* (2006.01)

(58) Field of Classification Search
CPC ............ G01R 33/4824; G01R 33/5601; G01R 33/5611; G01R 33/5618; G01R 33/4818
See application file for complete search history.

(56) References Cited

U.S. PATENT DOCUMENTS

| | | |
|---|---|---|
| 2014/0084918 A1 | 3/2014 | Kurokawa |
| 2015/0185301 A1 | 7/2015 | Hsu et al. |
| 2017/0212197 A1 | 7/2017 | Li et al. |
| 2019/0011520 A1* | 1/2019 | Feiweier ................ G01R 33/56 |

* cited by examiner

MAGNETIC RESONANCE IMAGING METHOD AND SYSTEM WITH OPTIMAL VARIABLE FLIP ANGLES

CROSS-REFERENCE TO RELATED APPLICATION APPLICATIONS

This application is a § 371 U.S. National Stage Application of International Application No. PCT/US2018/057007 filed on Oct. 23, 2018, and claims priority to U.S. Provisional Application No. 62/576,226 filed on Oct. 24, 2017, the entire contents of which are herein incorporated by reference.

BACKGROUND

1. Field of the Invention

The present invention relates to methods and systems for improving image quality of magnetic resonance (MR) imaging using optimal variable flip angle distribution, in particular, to methods and systems for improving image quality of MR imaging using optimal variable flip angle distribution that is determined based on a simulated relationship between each flip angle and at least one objective function for the MR imaging.

2. Description of the Related Art

Magnetic Resonance Imaging (MRI) is one of the most important modern medical imaging modalities. It has far less risk of side effects than most other imaging modalities such as radioscopy with x-rays or computed tomography because patients and medical personnel are not subjected to ionizing radiation exposure in the procedure. The use of MRI has grown very fast. Every year, more than 30 million MRI scans are performed in the United States; more than 60 million MRI scans are performed worldwide. Doctors often recommend MRI for the diagnosis of various diseases, such as tumors, strokes, heart problems, and spine diseases. A high-quality scan is important for maximizing diagnostic sensitivity and accuracy. Generally, high quality images are characterized by high signal to noise ratio (SNR), high contrast between normal and pathological tissues, low levels of artifacts, and appropriate spatial-temporal resolution In order to obtain a detectable MR signal, the object/subject examined is positioned in a homogeneous static magnetic field so that the object's nuclear spins generate net magnetization oriented along the static magnetic field. The net magnetization is rotated away from the static magnetic field using a radio frequency (RF) excitation field with the same frequency as the Larmor frequency of the nucleus. The angle of rotation is determined by the field strength of the RF excitation pulse and its duration. In the end of the RF excitation pulse, the nuclei, in relaxing to their normal spin conditions, generate a decaying signal (the "MR signal") at the same radio frequency as the RF excitation. The MR signal is picked up by a receive coil, amplified and processed. The acquired measurements, which are collected in the spatial frequency domain, are digitized and stored as complex numerical values in a "k-space" matrix. An associated MR image may be reconstructed from the k-space data, for example, by an inverse 2D or 3D fast Fourier transformation (FFT) from the raw k-space data.

U.S. Pat. No. 5,704,357 to Mitsue Miyazaki et al. discloses that the variable flip angles of refocusing pulses in a fast spin echo method instead of the customarily large number of 180° refocusing pulses in the spin echo method is used to reduce the radiofrequency load for MRI safety or amount of RF energy that may be applied per unit of time (so-called Specific Absorption Rate or SAR).

WO 2003/093855 A1 to Tobias Schaffter discloses that the implement of variable flip angle of the RE excitation. pulse instead of constant flip angle in different phase encoding acquisition to state free precession MRI sequence is applied to reduce SAR. In this disclosure, it assumes a maximum value flip angle when the absolute value of the phase encoding value (k) is minimum, and that it assumes a minimum value flip angle when the absolute value of the phase encoding value (k) is maximum during the acquisition of the set of gradient echo signals.

U.S. Pat. Nos. 7,227,356 B1 and 7,671,590 B2 to Han Hariharan et al. disclose that a method and apparatus of automatically determining the flip angle train for a multi-echo acquisition of data from a given tissue type to reduce ringing artifacts. These references focus on the effects of amplitude decay in the echo signal and the reduction of ringing artifacts. That is, the references focus on the high-spatial k-space components. The flip angle for each data acquisition pulse is determined from a polynomial expression recalled from a database of stored flip angle polynomial expressions closely matching both the tissue type and desired scan parameters. The variable flip angles may not be optimal.

U.S. Pat. No. 7,164,268 B2 to John P. Mugler et al. discloses a method and apparatus for lengthening the usable echo-train duration and reducing the power deposition for imaging. The variable flip angles and phases of refocusing radio-frequency pulses are calculated using desired prescribed signal evolution and desired overall signal level. However, the desired prescribed signal evolution and desired overall signal level may not be optimal or best for image quality.

U.S. Pat. No. 7,705,597 B2 to Wilhelm Horger et al. discloses a method and an apparatus for acquiring magnetic resonance imaging data with different types of contrast weightings. This invention is based on desired prescribed signal evolution for FSE. This patent is an utilization of U.S. Pat. No. 7,164,268 B2 to John P. Mugler et al. to achieve different image contrasts by the selection of imaging parameters.

U.S. Pat. No. 8,212,562 B2 to Wayne R. Dannels discloses a simplified method for estimating the resulting detectable transverse component of echo signal at each echo in a practical variable flip angle pulse sequence in spin echo train. The variable flip angle for MRI echo train is determined by a target train of detectable spin-locked NMR echo signal amplitudes.

U.S. Pat. No. 8,228,060 B2 to Reed F. Busse discloses a method and apparatus for calculating or generating a flip angle schedule for long spin echo train pulse sequences with reduced refocusing flip angles in fast spin echo. Flip angles are then calculated from the target signal schedule which comprises a first phase configured to establish a pseudo-steady state and a different, second phase subsequent to the first phase where each of the target signals increase from a pre-defined minimum signal value to a pre-defined maximum signal value. But the target signal schedule may not be the best and optimal for the fast spin echo.

U.S. Pat. No. 8,334,691 B2 to Vivian S. Lee et al. discloses a new ultra-fast magnetic resonance imaging for non-contrast agent magnetic resonance angiography half Fourier turbo spin echo based acquisition with variable flip angle evolution and high resolution in a short time and with low SAR at high field systems. This patent is an utilization of turbo spin echo with variable flip angles in non-contrast agent magnetic resonance angiography.

U.S. Pat. No. 8,432,166 132 to Pauline W. Worters et al. discloses a magnetic resonance imaging system or method in balanced steady-state free-precession transient imaging for implementing variable flip angles for a predefined signal profile. However, the target signal schedule may not be the best and optimal for the balanced steady-state free-precession.

International Publication No. WO 2013/042466A1 and U.S. Pat. No. 9,018,953 B2 to Masaaki Umeda disclose a system and method of magnetic resonance imaging using a spin echo sequence with changing a flip angle of the refocus pulse to reduce the SAR.

U.S. Patent Application Publication No. 2015/0160320 A1 to Kelvin Chow et al, discloses a magnetic resonance imaging system including a balanced steady-state free-precession transient imaging device capable of increasing the overall signal during the acquisition by full or better utilization of the magnetization through variable RF flip angles that are determined according to a modulation function.

U.S. RE45725 E1 to John P. Mugler et al. discloses a method and apparatus for using a series of refocusing RF pulses with variable flip angles in a spin-echo-train MRI pulse sequence. The flip-angle series is designed to achieve a prescribed signal evolution during the echo train.

U.S. Patent Application Publication No. 2016/0313427A1 to Daniel B. Ennis et al. discloses a system and method that uses balanced steady state free precession with variable flip angles are used with an interleaved multi-shot spiral-out phase encode ordering strategy to acquire high resolution 3 dimensional $T_2$-weighted images.

International Publication No. WO 2014/144662 A1 and U.S. Patent Application Publication No. 2016/0033610A1 to Subashini Srinivasan and Daniel B. Ennis disclose a system and method of magnetic resonance imaging using variable flip angle balanced steady-state free precession sequence to improve contrast-to-noise ratio without increasing SAR. The variable flip angle is determined to acquire low spatial frequencies with high flip angles and high spatial frequencies with low flip angles.

International Publication No. WO 2015/110909 A1 to Andre Hallack et al. discloses a system and method to apply variable flip angle or variable pulse repetition time technique to improve in accuracy and precision in dynamic contrast enhanced MRI-based pharmacokinetic analysis.

U.S. Patent Application PublicationNo. 2016/01095 1 to Hoonjae Lee and Jin young Hwang disclose a method and apparatus for acquiring the image using a fast spin-echo pulse sequence which variable flip angles which are determined by a pseudo-steady state model of a flip angle schedule.

U.S. Pat. No. 9,146,293 B2 and International Publication No. WO 2016/145355 A1 to Jinghua Wang et al. disclose a method and apparatus for optimization of MRI protocols. Their disclosures focus on constant flip angles for excitation radiofrequency pulse train and low-spatial k-space components or center of k-space.

U.S. Pat. No. 9,983,286 132 to Mitsue Miyazaki et al. discloses a system to reduce SAR in fast advanced spin echo or single-shot fast spin echo imaging.

U.S. Patent Application Publication No. 2017/0035301A1 to Silke Maria. Lechner-Greite et al. disclosed a system and method which extracts temperature changes from PD and $T_1$ weighted images acquired with zero echo time imaging using a variable flip angle method.

International Publication No. WO 2017/192557A1 to Kyung Sung et al. discloses a system and method to perform quantitative dynamic contrast-enhanced magnetic resonance imaging using three-dimensional radiofrequency-spoiled gradient echo images with variable flip angles to generate the parametric map measurements.

International Publication No. WO 2018/109086A1 to Benedikt Rieger and Sebastian Weingartner discloses a system and method to apply variable flip angles echo-planar imaging for magnetic resonance fingerprinting.

In summary, the literatures mentioned above focus on spin echo sequence, state free precession sequence, balanced steady-state free precession sequence, or echo-planar imaging. Most variable flip angle acquisition manners mentioned above have been used for reducing SAR or quantifying relaxation time of $T_1$. So far no literature discloses a method to determine optimal variable flip angle distribution so that the image quality of images acquired with the optimal variable flip angle distribution can be greatly improved.

SUMMARY

The optimal variable flip angles disclosed herein are available for any sequences, including spin echo and gradient echo sequences before these sequence do not reach a steady state of magnetization. It is available not only for the sequences mentioned above, but also for echo train acquisition such as magnetization preparation rapid gradient echo sequence (IR-GRE), magnetization preparation fast spin echo sequences, gradient- and spin-echo (GRASE) sequences.

All variable flip angles mentioned in the background section are used for (1) reduced SAR; (2) prescribed signal or contrast evolution; (3) quantified quantitative parameters. Generally, prescribed signal or contrast evolution is suboptimal so that the fullest potential of the sequences cannot be achieved. The optimal variable flip angles according to the present disclosure are estimated for each acquisition of k-space line and a given or optimal k-space strategy in order to improve the image quality. Additionally, most of the literatures mentioned in the background section focus on pseudosteady-state or steady-state of nuclear spins precession, while the present disclosure considers both transient state and steady-state during the image acquisition.

In one embodiment, a method for obtaining a magnetic resonance (MR) image is provided. The method includes receiving MRI parameters for a target tissue, selecting at least one objective function from a plurality of objective functions, simulating a relationship between each flip angle and the at least one objective functions based on the MRI parameters, determining optimal variable flip angle distribution to reach optimization of the at least one objective function for whole acquisition of the MR image, selecting or optimizing a k-space strategy, applying a plurality of radio frequency (RF) pulses with the optimal variable flip angle distribution and the k-space strategy to a target area in an object, receiving MR signals from the target area, the MR signals corresponding to the plurality of RF pulses, acquiring, in the k-space strategy, k-space lines based on the MR signals, and reconstructing the MR image from the k-space lines.

In another embodiment, a magnetic resonance imaging (MRI) system is provided. The MRI system includes a magnetic field generating unit configured to apply a plurality of RF pulses with a variable flip angle to a target area in the object, a receiver configured to receive MR signals from the target area, a processing unit, a system memory, and machine readable instructions stored in the system memory. The machine readable instructions, when executed by the processing unit, cause the processing unit to: receive MRI parameters for the target tissue, select at least one objective function from a plurality of objective functions, simulate a relationship between each flip angle and the at least one objective function based on the MRI parameters, determine optimal variable flip angle distribution to reach optimization of the at least one objective function for whole acquisition of an MR image, select or optimize a k-space strategy, apply a plurality of radio frequency (RF) pulses with the optimal variable flip angle distribution and the k-space strategy to a target area in an object, receive MR signals from the target area, the MR signals corresponding to the plurality of RF pulses, acquire, in the k-space strategy, k-space lines based on the MR signals, and reconstruct the MR image from the k-space lines.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other.

Like reference numerals designate corresponding parts throughout the several views.

DETAILED DESCRIPTION

1. Definition

Figure 1:
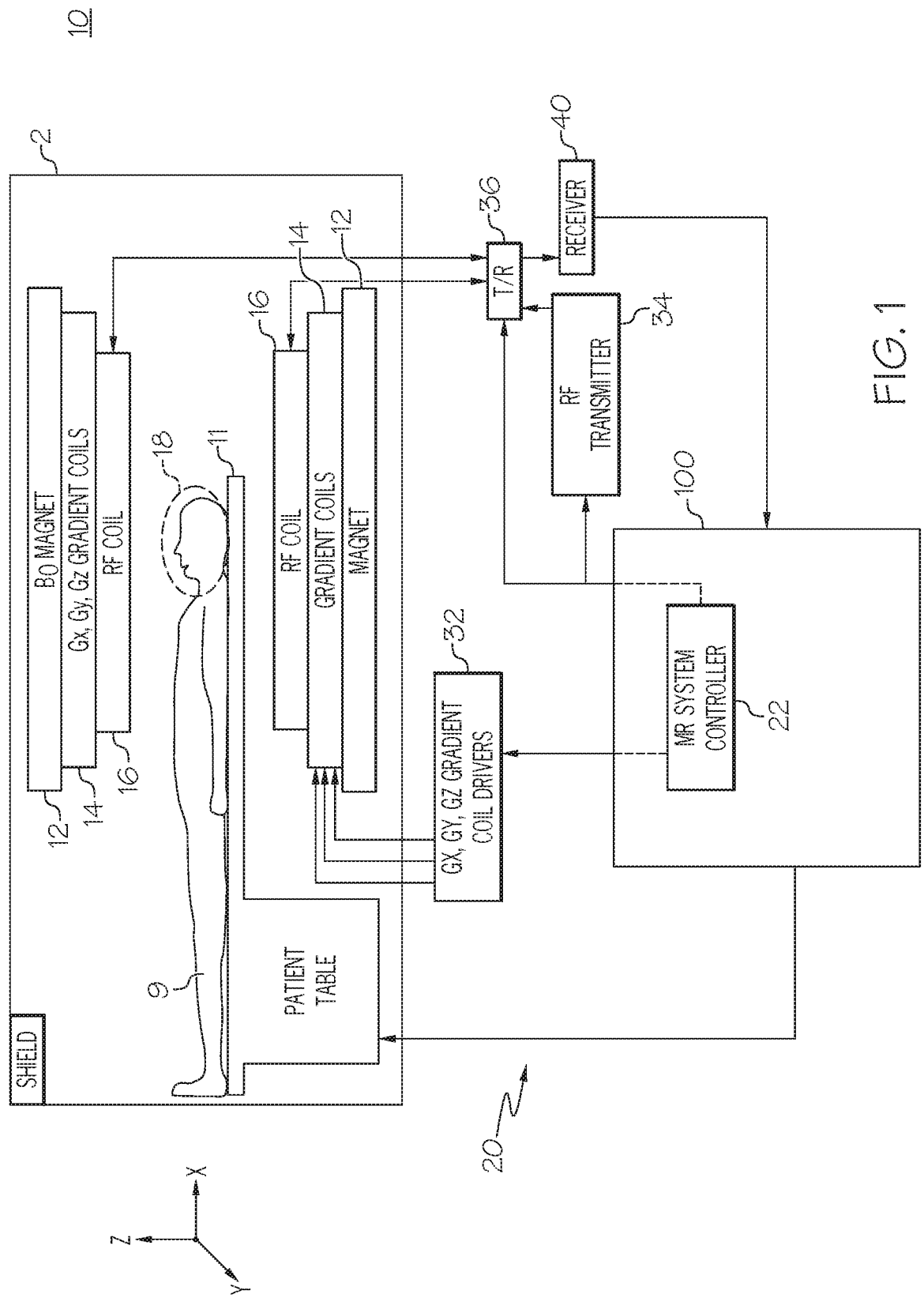
FIG. 1 is a diagram illustrating an example MRI system according to one or more embodiments shown and described herein.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not.

While implementations will be described for optimizing MRI scanner settings (also referred to herein as "basic scanner settings"), MRI protocols, variable flip angle, k-space strategy, and/or imaging parameters with regard to MRI modalities, it will become evident to those skilled in the art that the implementations are not limited thereto, but are applicable to other image modalities such as, computed tomography. Additionally, this disclosure contemplates that MRI modalities include MRI techniques with administration of contrast agents, for example, contrast enhanced MR angiography. This disclosure contemplates that the images obtained using the techniques described herein may be directly employed in at least one of diagnosing diseases, monitoring prognosis and therapeutic responses, conducting treatment plans, and improving quantification of MRI. For example, the techniques described herein may be used for the diagnoses of specific diseases such as the standardization of the MRI protocol in The Alzheimer's Disease Neuroimaging Initiative. Additionally, the techniques described herein are optionally applicable to a group of individuals in a similar pathophysiological situation.

The term "refocusing radiofrequency pulse train" and variations thereof as used herein encompass all of these possibilities, including, but not limited thereto, RARE, turbo-SE, fast-SE and GRASE imaging with and/or without magnetization preparation, because the present invention deals with, among other things, the RE-pulse history during the echo train, not the details of the spatial encoding.

The term "excitation radiofrequency pulse train" and variations thereof as used herein encompass all of these possibilities, including, but not limited thereto, MPRAGE, FSPGR, FEE, imaging with and/or without magnetization preparation.

The term "gradient pulse train" and variations thereof as used herein encompass all of these possibilities, including, but not limited thereto, spin-echo echo-planar imaging, gradient-echo echo-planar imaging, steady-state free precession imaging, and balanced steady-state free precession imaging with and/or without magnetization preparation.

The term "echo train" and variations thereof as used herein include at least one of excitation radiofrequency pulse train, refocusing radiofrequency pulse train, gradient pulse train and their combination.

The term "each acquisition" and variations thereof as used herein is used synonymously with the term "each k-space line" or "each phase-encoding" or "each readout radiofrequency pulse" or "each echo" or "each readout gradient pulse" and variations thereof and are open, non-limiting terms.

The term "MRI parameters" and variations thereof as used herein indicate that characteristics of a targeted tissue associated with MRI. The MR parameters are static field strength and pathophysiology dependent. For example, the MR parameters include, but are not limited to, $T_1$ relaxation, $T_2$ relaxation, $T_2$ star relaxation, proton density, diffusion, magnetic susceptibility, oxygen/deoxgen-hemoglobin or magnetization transfer. This disclosure contemplates that the MR parameters can include other parameters related to objective functions. It should be understood that the MR parameters could be obtained from the literature and/or estimated from experimental results.

The term "k-space" and variations (such as frequency domain or raw data) thereof as used herein indicate the data space in which MRI raw data is acquired. In contrast to this, the Fourier-transformed counterpart of the k-space is defined as an image space or image domain. Each data point in k-space represents a different superposition of the tissue signals.

The term "reconstructing image" and variations thereof as used herein indicate a process is to transform the acquired k-space data (e.g., raw data) into images.

SNR is used in imaging as a physical measure of the sensitivity of an imaging system which is defined as:

$$SNR=0.66*\mu_{signal}/\sigma_{background} \qquad \text{Equation (1)}$$

where $\mu_{signal}$ is the average signal intensity of region of interest (ROI). $\sigma_{background}$ is the standard deviation of signal intensity of background region and 0.66 a correction factor that takes into account the fact that the noise is governed by the Rayleigh distribution {reference}.

The SNR efficiency, $SNR_{eff}$, is used to quantitatively evaluate image quality and efficiency. It is defined as SNR per square root total scan time (TA), is given by Eq. 2 below.

$$SNR_{eff}=SNR/\sqrt{TA} \qquad \text{Equation (2)}$$

A single type of tissue may have different signal intensities because of signal inhomogeneity caused by non-uniform transmit field and receive sensitivity. Thus, SNR of the single tissue may not be the best metric to evaluate image quality sometimes. Instead, global SNR may be used as an indicator to evaluate the image quality at that case, avoiding the error caused by signal inhomogeneity.

As used herein, contrast is defined as:

$$\text{Contrast}=\mu_A-\mu_B \qquad \text{Equation (3)}$$

where $\mu_A$ and $\mu_B$ are the average signal value of regions A and B, respectively. It should be understood that other definitions of contrast may also be used as the objective function, such as Weber contrast and Michelson contrast, for example.

CNR is used as a metric to determine image quality, and is defined as:

$$CNR=0.66*\text{Contrast}/\sigma_{background} \qquad \text{Equation (4)}$$

The CNR efficiency is defined as CNR per square root of total scan time (TA) as given by Eq. 5 below:

$$CNR_{eff}=CNR/\sqrt{TA}; \qquad \text{Equation (5)}$$

The enhancement of lesion (EL) (also referred to herein as a lesion enhancement metric) is used to describe the change in signal intensity of a lesion (also referred to herein as lesion tissue) in images acquired before and after the administration of contrast agent, respectively. It is noted that Gd-related $T_2$-shortening generally reduces signal and works against the $T_1$-related signal enhancement. In order to simultaneously cover both $T_1$ contrast agent and $T_2^*$ contrast agent described herein, the lesion enhancement metric is absolute MR signal change before and after the administration of contrast agent, that is, the lesion enhancement metric (EL) is defined by Eq. 6 below:

$$EL[\%] = \left|\frac{S_a-S_b}{S_b}\right| \cdot 100; \qquad \text{Equation (6)}$$

$S_b$ and $S_a$ are the signal intensity of an lesion region of interest (ROI) before and after the administration of contrast agent, respectively. In order to describe the efficiency of contrast agent, the enhancement efficiency $EL_{eff}$ is introduced and it is defined as EL per square root of total scan time (TA) as given by Eq. 7 below:

$$EL_{eff}=EL/\sqrt{TA}, \qquad \text{Equation (7)}$$

Any of the image quality metrics defined above may be used as objective functions for the optimization for both pre-contrast imaging and post-contrast imaging. It should be understood that this disclosure is not limited to using the image quality metrics described herein. This disclosure contemplates that the method of data analysis will determine whether or not the objective functions for both pre-contrast and post-contrast imaging should be applied.

2. MRI System Overview

FIG. 1 depicts an MRI system 10, according to one or more embodiments described and shown herewith. In embodiments, the MRI system 10 shown in FIG. 1 includes a patient table 11, a static magnetic field generating unit 12, a gradient magnetic field generating unit 14 for generating respective magnetic fields in proximity to a target area 18 of an object 9, a transmitting and receiving unit 16, and a computing device 100. The patient table 11, the static magnetic field generating unit 12, the gradient magnetic field generating unit 14, and the transmitting and receiving unit 16 are placed within MRI RF shielding area 2 where noise of radio frequency is prevented from entering.

The static magnetic field generating unit 12 includes a main magnet configured to generate a strong static magnetic field in proximity to the target area 18 of the object 9.

The static magnetic field generating unit 12 may be arranged to surround the target area 18 of the object 9. For example, the static magnetic field generating unit 12 may be a cylindrical-shaped unit. The gradient magnetic field generating unit 14 includes gradient magnetic field coils for generating gradient magnetic fields in an x-axis direction, a y-axis direction, and a z-axis direction, which are orthogonal to each other. The gradient magnetic field generating unit 14 may be arranged to surround the target area 18 of the object 9. For example, the gradient magnetic field generating unit 14 may be a cylindrical-shaped unit.

In embodiments, the transmitting and receiving unit 16 may include a transmission coil and a receiving coil. The transmission coil irradiates RF pulses to the object 9 and the receiving coil receives MR signals generated by the object 9. In some embodiments, the transmitting and receiving unit 16 may include a transceiver coil having the functions of both the transmission coil and the receiving coil. The receiving coil may be composed of, for example, a so-called array coil in which, for example, a plurality of coil elements are disposed to detect the MR signals generated by the object 9. An RF transmitter 34 may control the transmission coil of the transmitting and receiving unit 16 to irradiate RF pulses. A receiver 40 may receive MR signals generated by the object 9 from the receiving coil of the transmission and receiving unit 16. The RF transmitter 34 and the receiver 40 may communicate with the transmitting and receiving unit 16 through a transmitter/receiver interface 36.

In embodiments, the MRI system 10 includes the computing device 100. The computing device 100 includes a MRI system controller 22. The MRI system controller 22 may control the operations of the gradient coil drivers 32 that activate the gradient coils of the gradient magnetic field generating unit 14. The MRI system controller 22 may also control the operations of the RF transmitter 34 that activates the RF coil of the static magnetic field generating unit 12. The computing device 100 may receive MR signals from the receiving coil of the transmission and receiving unit 16 and reconstruct an MRI image based on the received MR signals. The details of the computing device 100 will be further described with reference to FIG. 1A below.

In embodiment, the computing device 100 may be operably coupled to other components of the MRI system 10, for example, using by any medium that facilitates data exchange between the components of the MRI system 10 and the computing device 100 including, but not limited to, wired, wireless and optical links. For example, the computing device 100 may convert the MR signals received from the transmitting and receiving unit 16 into k-space data. The computing device 100 may generate MR image data from the k-space data with image reconstruction processing. In some embodiments, the techniques for improving image quality with optimal variable flip angles may optionally be implemented using the MRI system 10.

3. Example Computing Device

Figure 1A:
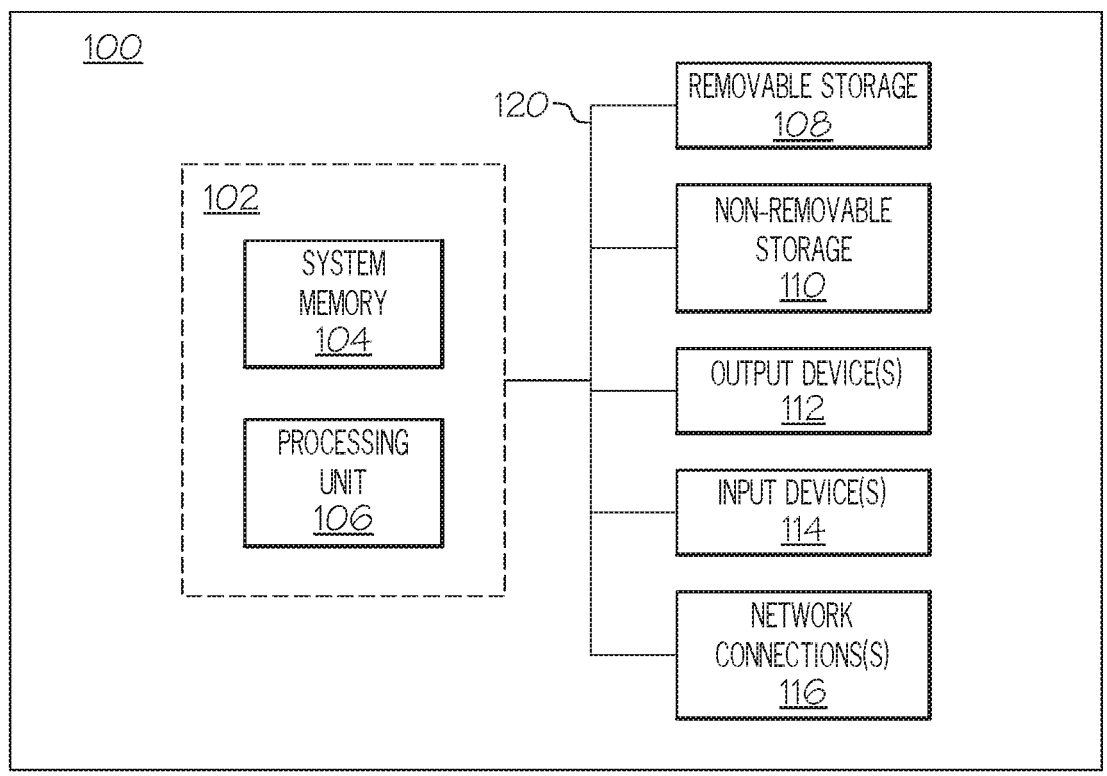
FIG. 1A is an example computing device according to one or more embodiments shown and described herein.

FIG. 1A depicts a computing device 100 according to one or more embodiments shown and described herein. It should be appreciated that the logical operations described herein with respect to the various figures may be implemented (1) as a sequence of computer implemented acts or program modules (i.e., software) running on a computing device (e.g., the computing device described in FIG. 1A), (2) as interconnected machine logic circuits or circuit modules (i.e., hardware) within the computing device and/or (3) a combination of software and hardware of the computing device. Thus, the logical operations discussed herein are not limited to any specific combination of hardware and software. The implementation is a matter of choice dependent on the performance and other requirements of the computing device. Accordingly, the logical operations described herein are referred to variously as operations, structural devices, acts, or modules. These operations, structural devices, acts and modules may be implemented in software, in firmware, in special purpose digital logic, and any combination thereof. It should also be appreciated that more or fewer operations may be performed than shown in the figures and described herein. These operations may also be performed in a different order than those described herein.

It should be understood that the computing device 100 is only one example of a suitable computing environment upon which embodiments of the invention may be implemented. Optionally, the computing device 100 may be a well-known computing system including, but not limited to, personal computers, servers, handheld or laptop devices, multiprocessor systems, microprocessor-based systems, network personal computers (PCs), minicomputers, mainframe computers, embedded systems, and/or distributed computing environments including a plurality of any of the above systems or devices. Distributed computing environments enable remote computing devices, which are connected to a communication network or other data transmission medium, to perform various tasks. In the distributed computing environment, the program modules, applications, and other data may be stored on local and/or remote computer storage media.

In embodiments, the computing device 100 includes a controller 102 that includes one or more processing units 106 and one or more system memory modules 104. The controller 102 may be the same controller as the MRI system controller 22 in FIG. 1. In other embodiments, the controller 102 may be a separate controller from the MRI system controller 22 in FIG. 1. Depending on the exact configuration and type of computing device, the one or more memory modules 104 may be volatile (such as random access memory (RAM)), non-volatile (such as read-only memory (ROM), flash memory, etc.), or some combination of the two. The one or more processing units 106 may be a standard programmable processor that performs arithmetic and logic operations necessary for operation of the computing device 100.

In embodiments, the computing device 100 includes communication path 120 that provides signal interconnectivity between various components of the computing device 100. Accordingly, the communication path 120 may communicatively couple any number of processing units 106 with one another, and allow the components coupled to the communication path 120 to operate in a distributed computing environment. Specifically, each of the components may operate as a node that may send and/or receive data. As used herein, the term "communicatively coupled" means that coupled components are capable of exchanging data signals with one another such as, for example, electrical signals via conductive medium, electromagnetic signals via air, optical signals via optical waveguides, and the like.

Accordingly, the communication path 120 may be formed from any medium that is capable of transmitting a signal such as, for example, conductive wires, conductive traces, optical waveguides, or the like. In some embodiments, the communication path 120 may facilitate the transmission of wireless signals, such as Wi-Fi, Bluetooth, Near Field Communication (NFC) and the like. Moreover, the communication path 120 may be formed from a combination of mediums capable of transmitting signals. In one embodiment, the communication path 120 comprises a combination of conductive traces, conductive wires, connectors, and buses that cooperate to permit the transmission of electrical data signals to components such as processors, memories, sensors, input devices, output devices, and communication devices. Accordingly, the communication path 120 may comprise a vehicle bus, such as for example a LIN bus, a CAN bus, a VAN bus, and the like. Additionally, it is noted that the term "signal" means a waveform (e.g., electrical, optical, magnetic, mechanical or electromagnetic), such as DC, AC, sinusoidal-wave, triangular-wave, square-wave, vibration, and the like, capable of traveling through a medium.

The one or more processing units 106 may be configured to execute program code encoded in tangible, computer-readable media. Tangible, computer-readable media refers to any media that is capable of providing data that causes the computing device 100 (i.e., a machine) to operate in a particular fashion. Various computer-readable media may be utilized to provide instructions to the one or more processing units 106 for execution. Example tangible, computer-readable media may include, but is not limited to, volatile media, non-volatile media, removable media and non-removable media implemented in any method or technology for storage of information such as computer readable instructions, data structures, program modules or other data. One or more system memory modules 104, a removable storage 108, and a non-removable storage 110 are all examples of tangible, computer storage media. Tangible, computer-readable recording media may include, but are not limited to, an integrated circuit (e.g., field-programmable gate array or application-specific IC), a hard disk, an optical disk, a magneto-optical disk, a floppy disk, a magnetic tape, a holographic storage medium, a solid-state device, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices.

In embodiments, the one or more processing units 106 may execute program code stored in the one or more system memory modules 104. For example, a bus may carry data to the one or more system memory modules 104, from which the one or more processing units 106 receive and execute instructions. The data received by the one or more system memory modules 104 may be optionally stored on the removable storage 108 or the non-removable storage 110 before or after execution by the processing unit 106.

In embodiments, the computing device 100 may include additional storage such as removable storage 108 and non-removable storage 110 including, but not limited to, magnetic or optical disks or tapes.

The computing device 100 may also have input device(s) 114 such as a keyboard, mouse, touch screen, etc. The input device may be manipulated by an operator to input signals to the MRI apparatus to set the imaging method group, the performing order, the imaging condition, and the like. The computing device 100 may also have output device(s) 112 such as a display, speakers, printer, etc. The output device 112 may output image data such as local image data, diagnosis image data using display, printer and other display. The additional devices may be connected to the bus in order to facilitate communication of data among the components of the computing device 100.

Computing device 100 may also contain network connection(s) 116 that allow the device to communicate with other devices. The network connection(s) 116 may be any device capable of transmitting and/or receiving data via a wireless network. Accordingly, the network connection(s) 116 may include a communication transceiver for sending and/or receiving data according to any wireless communication standard. For example, the network connection(s) 116 may include a chipset (e.g., antenna, processors, machine readable instructions, etc.) to communicate over wireless computer networks such as, for example, wireless fidelity (Wi-Fi), WiMax, Bluetooth, IrDA, Wireless USB, Z-Wave, ZigBee, or the like.

It should be understood that the various techniques described herein may be implemented in connection with hardware or software or, where appropriate, with a combination thereof. Thus, the methods and apparatuses of the presently disclosed subject matter, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computing device, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, e.g., through the use of an application programming interface (API), reusable controls, or the like. Such programs may be implemented in a high level procedural or object-oriented programming language to communicate with a computer system. However, the program(s) can be implemented in assembly or machine language, if desired. In any case, the language may be a compiled or interpreted language and it may be combined with hardware implementations.

In some embodiments, the computing device 100 may include a workflow setting unit, an imaging operation determining unit, and an image reconstruction unit. The workflow setting unit may be a program module stored in the system memory modules 104. The workflow setting unit sets a first workflow relating to the MRI examination by estimating an imaging time of each of the imaging methods in the performing order initially set by a scan plan. Further, the workflow setting unit sets a second workflow relating to the MRI examination by estimating a shortest performing order, by which an examination time necessary to sequentially perform a plurality of imaging methods constituting the imaging method group set by the input unit is minimized. The imaging operation determining unit determines whether an imaging operation during a main imaging is implemented according to the workflow. In embodiments, the workflow setting unit and/or the imaging operation unit may be implemented using hardware, software, and or a combination thereof.

The image reconstruction unit may include an MR signal storage unit, a signal processing unit, and an image data storage unit. The MR signal storage unit (e.g., memory) stores the MR signals, which are collected by the receiver unit of the transmitting and receiving unit 16. The signal processing unit has an image reconstruction processing unit and an image processing unit. The image reconstruction processing unit generates image data from the MR signal storage unit by image reconstruction processing, for example, performed by a Fourier transformation such as 2D FFT. When the MR signals to a three-dimensional region are collected, the image reconstruction processing unit of the signal processing unit generates volume data. Subsequently, the image processing unit generates three-dimensional image data such as volume rendering image data, surface rendering image data and the like or two-dimensional image data, multi planar reconstruction image data, and the like, because predetermined image processing is performed for the volume data generated by the image reconstruction processing unit. Then, the image data described above obtained by the signal processing unit are stored to the respective storage regions of the image data storage unit.

4. Theory

One of the major goals in MRI is to develop fast acquisition technology. To achieve this goal, spin-echo-train (refocusing RF echo train) and IR-GRE (exciting RF echo train) methods are routinely and widely used in clinical MRI.

1) Refocusing RF Pulses Train with Variable Flip Angles

Spin-echo based sequences are the most commonly used techniques in clinical MRI because of their robust and straightforward contrast behavior, and their insensitivity to susceptibility and field inhomogeneity effects. Fast spin echo sequence (also called rapid acquisition with relaxation enhancement or turbo spin echo) is very attractive for high-field strength applications, where susceptibility effects become increasingly important. However, their application at high-field strength is hindered by the high radiofrequency power deposition of long echo trains, which easily exceed the specific absorption rate (SAR) limits for patient safety. The refocusing RF pulses with variable flip angles are implemented to reduce both the SAR and signal amplitude decay for fast spin echo. All variable flip angles mentioned above are estimated using prescribed signal evolution or contrast evolution. In most cases, the prescribed evolution is not best for image quality. Therefore, it is very difficult to reach fullest potentials for image acquisition. If it were possible to find the relationship between signal evolution or contrast evolution and variable flip angles, optimal variable flip angle distribution may achieve maximum image contrast and reduce or minimize image artifacts. The optimal variable flip angle distribution according to the present disclosure may reach fullest potential of image sequences.

Spin-echo-based sequences provide a variety of image contrasts that highlight pathology and reduced image artifacts from susceptibility difference and static field inhomogeneity. Both 2D and 3D fast spin echo sequences may be used for contrast agent MRI. Additionally, the high-resolution 3D FSE may be used for assessing the complex anatomy of the joints. Various analytic and numerical algorithms, including extended phase graph (EPG)-algorithm and pseudo-steady state solution algorithm, may be used to describe the signal intensity of spin echo-based acquisition. Generally, conventional 3D fast spin echo sequences take several tens of minutes for sizeable volume coverage and limit their clinical application. Most recent years, 3D fast spin echo (or SPACE in Siemens, VISTA in Philips, CUBE in GE) have been optimized in clinically acceptable acquisition times through shortening the echo spacing, suppressing blurring with variable flip angles refocusing radiofrequency pulses, and increasing the useable duration of the spin-echo train. 3D fast spin echo sequences are growing in clinical application, including non-contrast agent and contrast agent MRI. Since these techniques apply relatively high, constant flip angles for the refocusing RF pulses for the lower k-space acquisition, there are subtle contrast differences between 2D and 3D fast spin echo. In present disclosure, a technique is described to optimize 3D fast spin echo-based sequence for contrast agent MRI with the use of one or more method for optimizing image quality metric. The technique uses at least one of analytic solution, extended phase graph (EPG)-algorithm, pseudo-steady-state solution algorithm, or windowed ramp approach. For example, the signal of a spin-echo sequence $F_{RR}(x)$ may be obtained by solving the Bloch's equation as follows:

$$SI(x) \propto M_0 \frac{\sin\alpha_{SE}(x) \cdot [1 - \cos(\beta_{SE}(x))] \cdot \begin{bmatrix} 1 - \cos\beta_{SE}(x) \cdot E_1 - \\ (1 - \cos\beta_{SE}(x)) \cdot E_1 \cdot e^{\frac{TE}{2T_1}} \end{bmatrix}}{1 - \cos\alpha_{SE}(x) \cdot \cos\beta_{SE}(x) \cdot E_1} \cdot e^{-\frac{TE}{T_2}} \quad \text{Equation (8)}$$

where $\alpha_{SE}(x)$ and $\beta_{SE}(x)$ are the corrected flip angles of the excitation and refocusing pulses at position x, where $E_1 = \exp(-TR/T_1)$, $T_1$ is the longitudinal relaxation time. When $T_1 \gg TE$ and $TR \gg T_1$, Eq. (8) can be simplified to:

$$SI(x) \propto \sin\alpha_{SE}(x) \cdot \sin^2\frac{\beta_{SE}(x)}{2} \quad \text{Equation (9)}$$

Generally, at least one of image quality metric including, but not limited to, signal intensity, signal-to-noise ratio (SNR), signal intensity efficiency, SNR efficiency, image resolution, total scan time, contrast, contrast-to-noise ratio (CNR), contrast efficiency, CNR efficiency, specific absorption rate (SAR) or image artifacts may be used as an objective function of protocol or sequence for computer simulation which generates the relationship between the objective function and the imaging parameters. That is, at least one of Equations 1-9 may be used for computer simulation, for example. It is noted that there is no analytic solution for Bloch Equation for complex sequences. For example, 3D fast spin echo with variable flip angle sequences (such as SPACE in Siemens, CUBE in GE, and VISTA in Phillips), signal intensity are described using one of approximation solution, numerical solution, and EPG algorithm (or coherence pathway). Complex sequences may include at least one of variable repetition time TR, a flip angle, a bandwidth, echo time, an echo number, and phases of radiofrequency pulses.

Variable-flip-angle techniques for FSE may focus on the application of variable-flip-angle refocusing RF pulses to achieve uniform signal amplitude over a substantial portion of a long spin-echo train. Nonetheless, the specific signal-evolution shape depends on the relaxation times for the tissue, and thus the shape may be different for other relaxation times.

In some embodiments, the images acquired with the optimized variable flip angles may be any MR images. For example, the acquisitions may be two spatial dimensional, three spatial dimensional or three spatial plus temporal and thus four-dimensional images. The images may be also at least one of magnitude images, phase images, real images, imaginary images, complex images, including combinations thereof. It should be understood, however, that the above images are provided only as examples and that this disclosure contemplates acquiring other types of MR images.

2) Excitation RF Pulse Train with Variable Flip Angles

Inversion-recovery gradient-recalled echo sequence (IR-GRE) is equivalent to MPRAGE magnetization prepared rapid gradient-echo and the inversion recovery spoiled gradient-echo (IR-SPGR or Fast SPGR with inversion activated or BRAVO), 3D turbo field echo (TFE), or 3D fast field echo (3D Fast FE). The sequence may provide important information about both pathology and structure. Generally, constant flip angles are used for excitation RF pulse train in MP-RAGE. The MP-RAGE sequence is composed of 3D-inversion recovery α and N equally-spaced readout RF pulses of flip angle θ and echo spacing τ. Repetition time TR is defined as the time interval between two successive inversion recovery pulses as shown by Eq. 10 below:

$$TR = TI + N \cdot \tau + TD,$$  Equation (10)
$$TR = TI + \left[\left[\frac{N}{2}\right] \cdot \tau\right] + TD.$$

where τ is echo spacing time, N is the total number of readout RF pulses, TI is the time interval between the inversion recovery pulse and the first RF readout pulse, and TD is delay time.

For successive excitations in the MP-RAGE sequence, signal intensity from the $i^{th}$ read-out pulse is given by Eq. 11 below:

$$SI \propto M_i^- \cdot \sin(\theta) = M_0 \cdot \sin(\theta) \cdot$$  Equation (11)
$$\left\{\frac{(1-\delta)[1-\mu^{i-1}]}{1-\mu} + (\mu)^{i-1} \cdot (1-\gamma) - \gamma \cdot \mu^{i-1} \cdot \frac{M_{eq}}{M_0}\right\},$$

In order to simplify the formula for signal intensity, followings definitions are used: =exp(−TI/$T_1$), δ=exp(−τ/$T_1$), ρ=exp(−TR/$T_1$), σ=exp(−TD/$T_1$), μ=δ·cos(θ).

The steady state magnetization $M_{eq}$ after several TRs is given by Equation 12 below:

$$M_{eq} = \frac{1 - \varphi + \frac{\varphi \cdot \cos(\theta) \cdot (1-\delta)[1-\mu^{N-1}]}{1-\mu} + \varphi \cdot \cos(\theta) \cdot \mu^{N-1} + \rho \cdot \cos(\alpha) \cdot \cos^N(\theta)}{1 - \rho \cdot \cos(\alpha) \cdot \cos^N(\theta)} \cdot M_0,$$  Equation (12)

The white matter (WM) and gray matter (GM) contrast from the $i^{th}$ read-out RF pulse is given by Equation 13 below:

$$\text{Con}_{i,WM-GM} \propto s_{i,WM} - s_{i,GM},$$  Equation (13)

where $s_{i,WM}$ and $s_{i,GM}$ are the signal intensities of WM and GM, which can be calculated using Equation 11 with the longitudinal relaxation times and protein densities of WM and GM, respectively. In Equation 13, the GM-WM contrast is a function of N, TI, τ, θ and the temporal position of the read-out RF pulse. Generally, the smaller the acquisition bandwidth is, the higher SNR and CNR are.

Although the property in the image domain is determined by all Fourier components in the entire k-space, contrast between WM and GM is mostly determined by the center of k-space which is associated with the low spatial frequency components in k-space. According to Equations 11-13, GM and WM contrast from the ith read-out RF pulse is a function of the temporal position of the RF pulse and the total number of read-out RF pulses N. In embodiments, the variable flip angle distribution is optimized for a given k-space strategy such that each k-space line is expected to be maximized for whole k-space. The k-space strategy may be at least one of a k-space sampling order, a rectilinear imaging, radial imaging, echo planar imaging, spiral imaging, projection reconstruction imaging, a random k-space trajectory, a under-sampled k-space trajectory, or a partial k-space sampling trajectory. The k-space sampling order May be at least one of a sequential sampling order, a centric sampling order, an interleave sampling order, a reverse sampling order, or a random sampling order

3) Gradient Pulse Train with Variable Flip Angle

Gradient pulse train sequences include spin-echo echo-planar imaging, gradient-echo echo-planar imaging, steady-state free precession imaging, but not limited thereto, and balanced steady-state free precession imaging with and/or without magnetization preparation. The variable flip angles for steady-state free precession are calculated from theoretical relations between the exponential of the pulse repetition time/relaxation time ratio and the total scan counts such that a modification of the variable angle scheme enables the acquisition of uniform signal amplitude throughout all scans.

Varying the flip angles in balanced steady-state free precession (also called True-HS FIESTA, Balanced-FFE, BASG, or True SSFP) sequences are used to modify contrast, reduce SAR while maintaining SN, provide constant transverse magnetization during the transient phase, and maintain constant transverse magnetization when imaging hyperpolarized nuclei. That is, the imaging sequences for variable flip angles may include at least one of gradient echo, spin echo, fast gradient echo, fast spin echo, but not limited to, and their variations with or without magnetization preparation and/or specific tissue suppression, parallel imaging technique, under-sampling technique, and/or the administration of contrast agent.

5. Method and Result

Figure 2A:
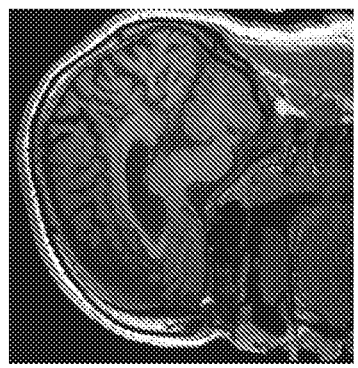
FIG. 2A depicts an exemplary MRI image.
Figure 2B:
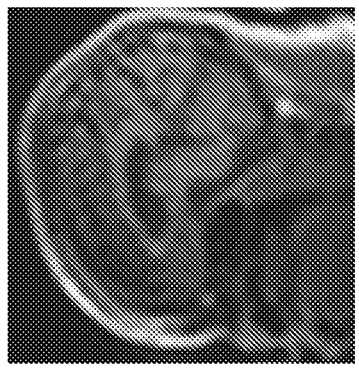
FIG. 2B depicts an exemplary MRI image.
Figure 2C:
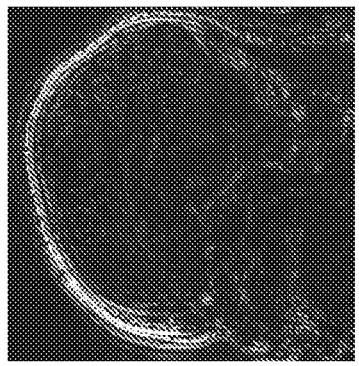
FIG. 2C depicts an exemplary MRI image.
Figure 2D:
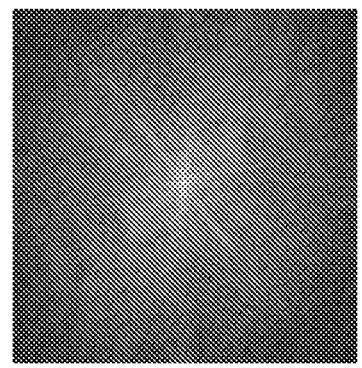
FIG. 2D depicts k-space components corresponding to the MRI image of FIG. 2A.
Figure 2E:
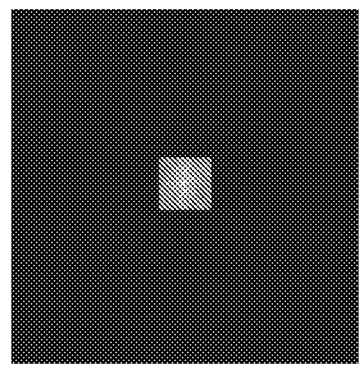
FIG. 2E depicts k-space components corresponding to the MRI image of FIG. 2B.
Figure 2F:
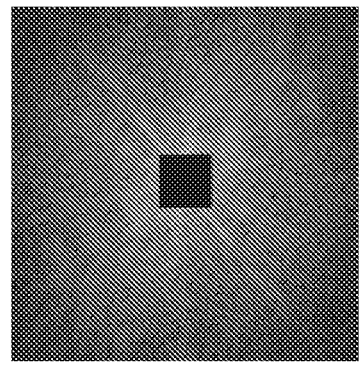
FIG. 2F depicts k-space components corresponding to the MRI image of FIG. 2C.

FIGS. 2A-2F depict images illustrating the effect of different k-space components (low, intermediate and high spatial frequencies) on the image quality. Generally, the center portion of k-space as shown in FIG. 2E contains low spatial frequency information that determines overall image contrast, signal intensity, and general shapes of the image of FIG. 2B. The periphery of k-space as shown in FIG. 2F contains high spatial frequency information that determines spatial resolution, sharpness and details of image of FIG. 2C. In order to obtain high quality image, whole k-space acquisition including both low and high spatial frequency k-space components should be optimized. For example, FIG. 2D depicts k-space including both low and high spatial frequency k-space components, and the corresponding image of FIG. 2A shows a high quality image.

The k-space strategy may include a k-space trajectory and a k-space sampling order. The k-space trajectory may include at least one of a rectilinear, radial, echo planar imaging, spiral, projection reconstruction, random k-space, under-sampled k-space, or partial k-space sampling trajectory, and the sampling order comprise at least one of a sequential, centric, interleave, reverse, or random sampling order. The optimal variable flip angles according to the present disclosure may include at least one of optimal variable flip angles for a given sampling trajectory or a given sampling order or both.

Figure 3:
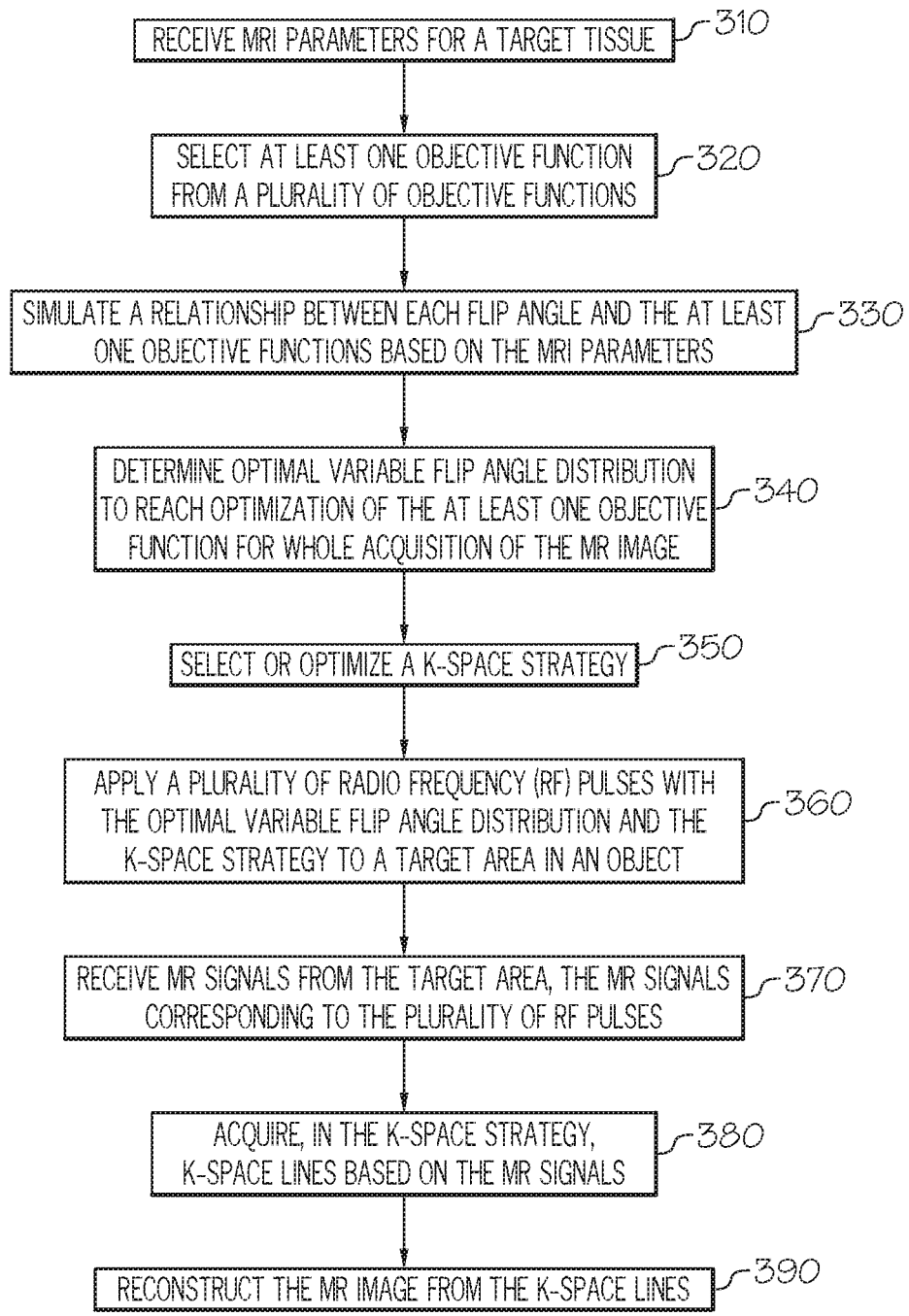
FIG. 3 is a flowchart illustrating an example operation for optimizing variable flip angles for each acquisition according to one or more embodiments shown and described herein.

FIG. 3 shows a flow diagram of acquiring images with optimal variable flip angle and data processing according to one or more embodiments shown and described herein. The optimization may include simulating a plurality of relationships between at least one of a plurality of objective functions and variable flip angles. In some embodiments, the simulation may be based on MRI scanner setting(s) and/or MR parameter(s) for target tissues.

In step 310, the MRI system 10 receives MRI parameters for a target tissue. The target tissues may include normal or healthy tissue and lesion tissues. For example, the gray matter and white matter or whole brain tissue volume may be used as a biomarker for neurodegenerative diseases. In that case, the healthy brain tissue is the target tissue. As another example, a patient with brain tumor may be examined using MRI. The enhanced tumor lesions are the target tissue in $T_1$-weighted contrast enhanced MRI exams.

In step 320, the MRI system 10 selects at least one objective function from a plurality of objective functions. The plurality of objective functions may include, but not limited to, signal intensity, signal-to-noise ratio (SNR), signal intensity efficiency, SNR efficiency, image resolution, total scan time, contrast, contrast-to-noise ratio (CNR), contrast efficiency, CNR efficiency, specific absorption rate (SAR) or image artifacts. For example, the MRI system may select the CNR efficiency and image artifacts.

Figure 4:
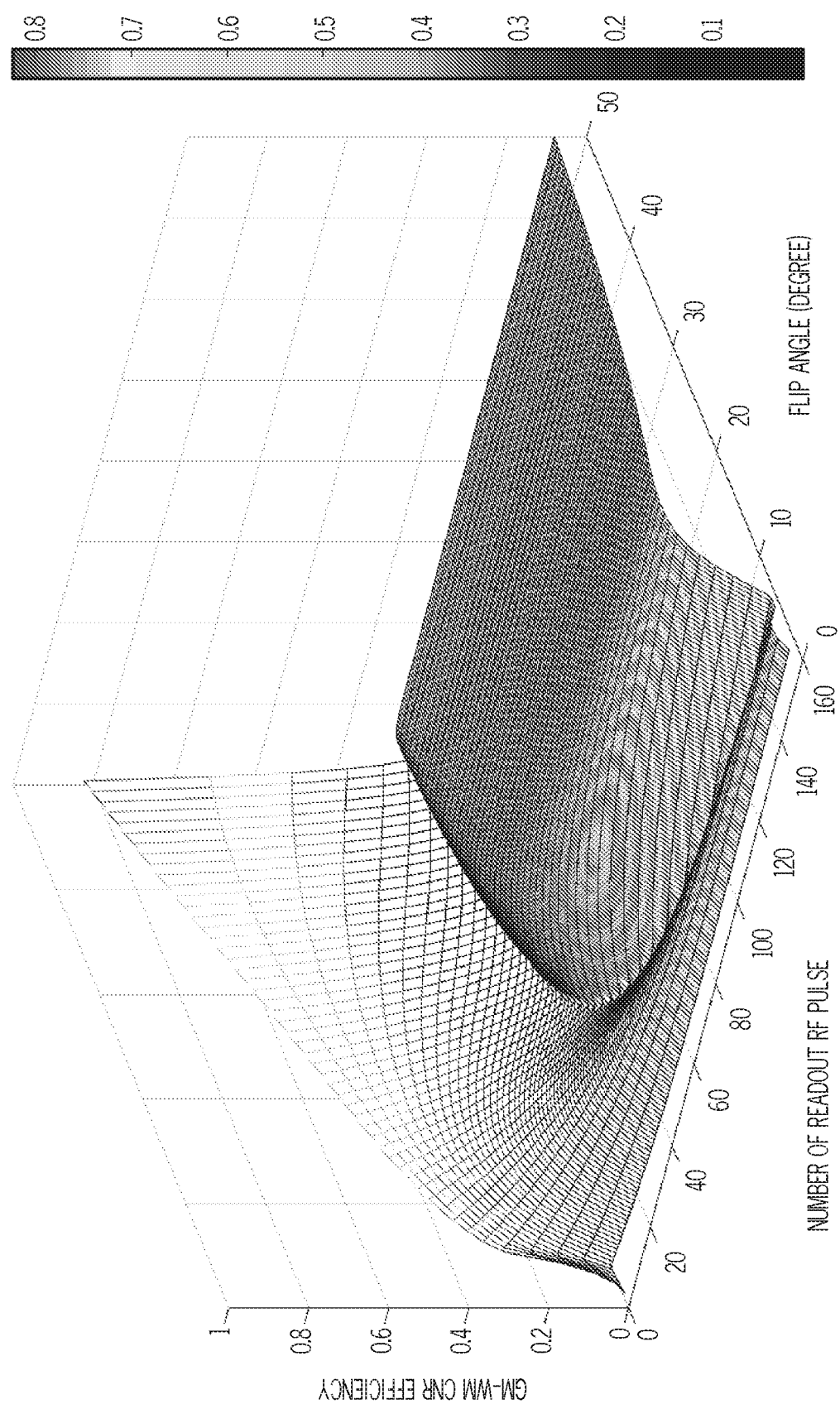
FIG. 4 is a graph illustrating an example operation for simulated gray matter—white matter contrast to noise (CNR) efficiency as a function of different constant flip angles and the number of readout excitation radiofrequency pulses in magnetization preparation rapid gradient echo sequence (IR-GRE).

In step 330, the MRI system 10 simulates a relationship between each flip angle and the at least one objective functions based on the MRI parameters. For example, the MRI system may simulate a relationship between each flip angle and the CNR efficiency based on Equations 11 through 13. FIG. 4 depicts an exemplary simulation between the GM-WM CNR efficiency and each flip angle, which will be described in detail below. As another example, the MRI system may simulate a relationship between each flip angle and image artifacts. The MRI system may simulate a relationship between each flip angle and any other objective functions including signal intensity, signal-to-noise ratio (SNR), signal intensity efficiency, SNR efficiency, image resolution, total scan time, contrast, contrast-to-noise ratio (CNR), contrast efficiency, or specific absorption rate (SAR).

In step 340, the MRI system 10 determines optimal variable flip angle distribution to reach optimization of the at least one objective function for whole acquisition of the MR image. In embodiments, the optimization of an object function maximizes image quality of the MR image. For example, the MRI determines optimal variable flip angle distribution that maximizes GM-WM CNR efficiency, which will be described in detail with references to FIGS. 4 and 5 below. As another example, the MRI system determines optimal variable flip angle distribution that minimizes image artifacts. In some embodiments, the MRI system balances the optimal variable flip angle distribution in order to maximize the CNR efficiency as well as minimize the image artifacts.

In step 350, the MRI system 10 selects or optimizes a k-space strategy. In embodiments, the MRI system may select a k-space strategy that maximizes CNR efficiency and minimizes image artifacts. In some embodiments, the MRI system may optimize a k-space strategy such that we can further improve the optimization of at least one objective function for whole k-space acquisition. The maximization of CNR efficiency is determined by low-spatial frequency component with the use of optimal variable flip angle distribution. However, the maximization of CNR efficiency does not minimize imaging artifacts because the details of image or spatial resolution are determined by high-spatial component with the use of optimal variable flip angle distribution. The MRI system determines the k-space strategy that maximizes CNR efficiency and minimizes imaging artifacts. For example, the k-space strategy is selected to assign maximum CNR efficiency in the center of k-space, secondary maximum CNR efficiency in high-spatial-frequency, and other CNR efficiency in mediate-spatial-frequency components of k-space.

In step 360, the MRI system 10 applies a plurality of RF pulses with the optimal variable flip angle distribution and the k-space strategy to a target area in an object. In embodiments, the computing device 100 may instruct the gradient coil drivers 32 to activate the gradient magnetic field generating unit 14 according to the optimal variable flip angle distribution and the k-space strategy. The gradient magnetic field generating unit 14 generates gradient magnetic fields in an x-axis direction, a y-axis direction, and a z-axis direction to the target area 18 of the object 9 in FIG. 1. Applying the RF pulses may further include using at least one of imaging techniques including at least one of parallel imaging technique, under-sampling technique including compressed sensing technique, or simultaneous multi-slice imaging technique. The RF pulses may be 2 dimensional or 3 dimensional, and include, but not limited to, one slab or multiple slabs IR-GRE sequence, fast spin echo sequence, steady-state free precession sequence, and balanced steady-state free precession sequence with and/or without magnetization preparation.

In step 370, the MRI system 10 receives MR signals from the target area which correspond to the plurality of RF pulses. In embodiments, the computing device 100 may receive MR signals from the receiving coil of the transmission and receiving unit 16 shown in FIG. 1.

In step 380, the MRI system 10 acquires, in the k-space strategy, k-space lines based on the MR signals. As described above, the k-space strategy enhances image quality of the MR image by balancing low-spatial frequency component and high-spatial frequency component, for example, the low-spatial frequency component in FIG. 2E and the high-spatial frequency component in FIG. 2F. Generally, MRI k-space acquisition is implemented during the steady states of a transverse nuclear magnetization which may reduce signal oscillations and achieve level signal intensity to during acquisition. However, various factors, such as timing constraints of physiological gating, MRI efficiency and use of contrast preparation mechanisms lead to the acquisition begins in the transient stage before the steady state is reached. In the present disclosure, MRI k-space acquisitions may be carried out with variable flip angles at both transient state and steady-state of transverse nuclear magnetization.

In step 390, the MRI system 10 reconstructs the MR image from the k-space lines. The MR images in the image domain may be applied in clinical and research settings to improve diagnosis of diseases, determine prognosis of diseases, and monitor therapeutic response.

FIG. 4 shows a graph illustrating simulated GM-WM CNR efficiency as a function of different constant flip angles and the number of excitation radiofrequency pulses in IR-GRE sequence. T1 relaxation times of the GM, WM, and cerebrospinal fluid (CSF) of adult healthy human brain are 1300 milliseconds (ms), 900 ms, 3500 ms at 3.0 T, respectively. T2 relaxation times of the GM, WM, and CSF of adult healthy human brain are 100 ms, 90 ms, 300 ms at 3.0 T, respectively. Proton densities of the GM, WM, and CSF of adult healthy human brain are 0.75, 0.65, 1.0 at 3.0 T, respectively.

These MRI parameters are used to simulate the GM-WM CNR efficiency. The results show the highest CNR efficiency at the transient state of excitation RF echo train which is rapidly reduced with the increasing echo acquisition at the echo acquisition number of less than 20. Additionally, the highest CNR efficiency is also reduced with the decrease of flip angles when the flip angle is less than 90 degree. When the number of echo acquisition is around 30th, the CNR efficiency becomes minimal and increases with the increasing echo acquisition up to around 40th and then slowly reduces as the number of echo acquisition increases with a constant flip angle. But at the constant flip angles of from 5 to 20 degree, the CNR efficiency becomes minimal at around 50 RF pulse readout and then slowly increases with the increasing echo acquisition. The highest CNR efficiency for large number of echo acquisition occurs at around 15 degree.

Based on the simulation results, the acquisition with a flip angle of more than 30 degrees should be used to fill the low-spatial frequency components of k-space to maximize the CNR efficiency. However, the acquisition with relatively low flip angle of around 15 degrees should be used to fill the high-spatial frequency components of k-space to reduce the blurring artifacts and increase the resolution of image. The flip angles for both high-spatial and low-spatial frequency components of k-space are far beyond the constant flip angle of conventional clinical practice of 8-12 degrees which is very close to so-called Ernst angle for interval time between the nearest two k-space lines or echo spacing time in Equation (10).

In FIG. 4, gray matter (GM)-white matter (WM) CNR efficiency is used as an objective function to simulate the CNR efficiency as a function of both each RF pulse readout (e.g., each k-space line) and a flip angle by the solution of Bloch equations for the IR-GRE sequence and MR parameters of a brain tissue. The objective function may include at least one of lesion location, lesion border delineation, lesion morphology, contrast or contrast efficiency between lesion tissue and healthy tissue, CNR or CNR efficiency between lesion tissue and healthy tissue, signal intensity, signal intensity efficiency, image resolution, total scan time or image artifact. Additionally, at least one of analytic solution, approximation solution, numerical solution, and EPG algorithm of Bloch equations for the imaging sequence and MR parameters of a tissue also may be used to simulate the relationship between the objective function and each k-space acquisition.

Generally, a k-space strategy is given for a sequence in commercial MRI scanner. If the k-space strategy is not given, the k-space strategy needs to be performed. Herein, optimal variable flip angles include at least one of optimal variable flip angles for a given sampling trajectory or a given sampling order or both.

As described herein, MRI parameters may change based on at the least one of an age, a pathophysiological change, a physiological change, an electrophysiological change, a disease in tissue, an implanted or injected material, or in-take of medicine. The MRI parameters may include, but are not limited to, at least one of $T_1$ relaxation time, $T_2$ relaxation time, $T_2$ star relaxation time, proton density, diffusion, magnetic susceptibility, oxygen/deoxygenated-hemoglobin, or magnetization transfer. The MRI parameters may be estimated using MRI/MRS measurements or obtained from the public publications including papers, but not limit to, patents, research reports, or books. In some embodiments, the one or more MR parameters of the targeted tissue or lesion also may be estimated by experiments. That is, the one or more MR parameters of the targeted tissue or lesion are known or readily estimated. For example, $T_1$, $T_2$, and proton density of the gray matter (GM), white matter (WM) and cerebrospinal fluid (CSF) of adult healthy human brain are 1300/900/3500 ms, 100/90/300 ms, and 0.75/0.65/1.0 at 3.0 Tesla, respectively. The simulation is performed based on MATLAB programming.

In some case, image artifacts can directly influence the application of image in clinical practices. For example, motion artifacts can lead to very bad image quality in cardiac imaging and neonate imaging. The image artifact can include at least one of susceptibility artifact, geometry distortion, signal inhomogeneity, cross excitation, cross-talk artifact, motion, chemical shift artifact, or contrast agent leakage into healthy tissue.

Figure 5:
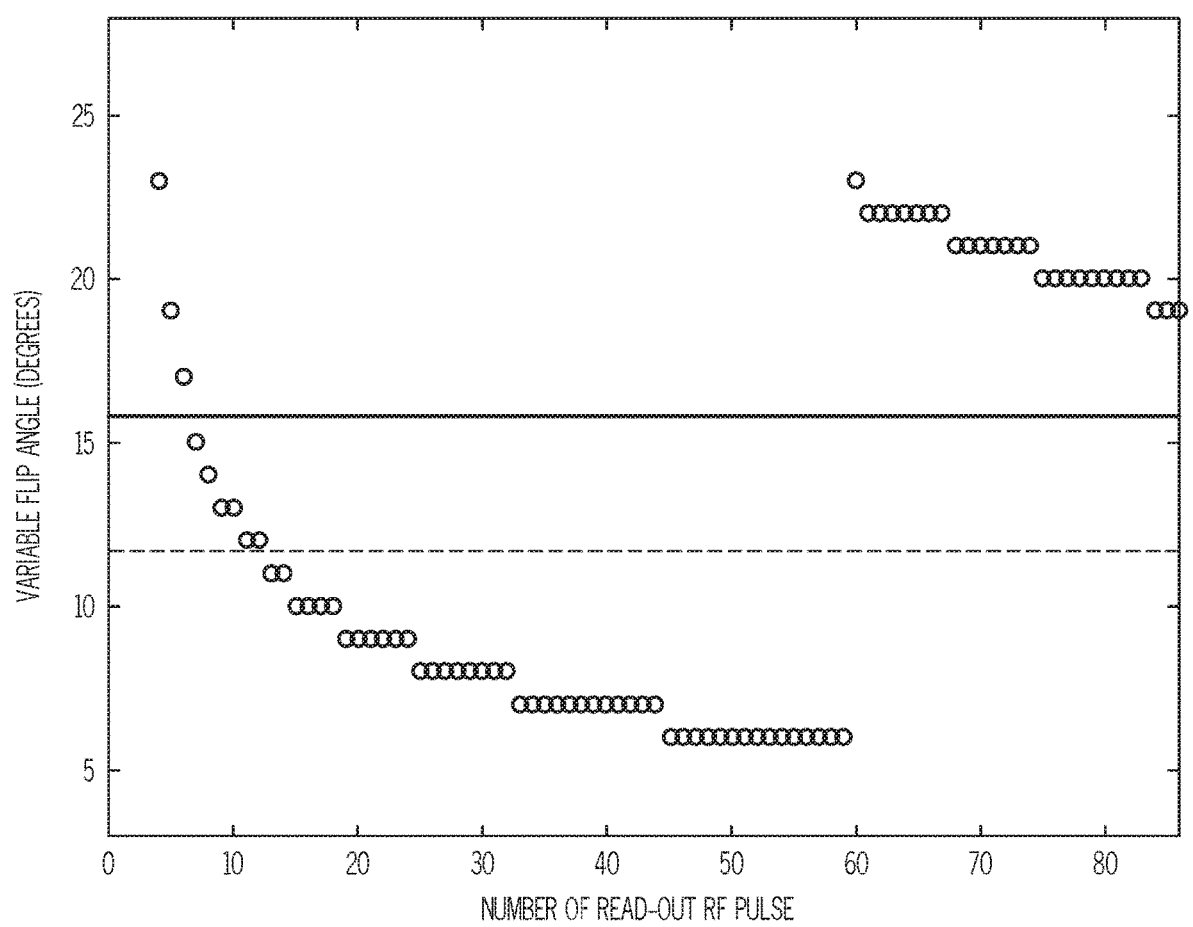
FIG. 5 is a graph illustrating an example of optimal variable flip angles distribution as a function of the number of readout excitation radiofrequency pulses to maximize gray matter—white matter contrast to noise (CNR) efficiency for each excitation radiofrequency pulse.

FIG. 5 is a graph illustrating optimal variable flip angle distribution as a function of the number of excitation radiofrequency pulses that maximizes the GM-WM CNR efficiency for each excitation radiofrequency pulse. The optimal variable flip angles are calculated from the simulation depicted in FIG. 4. For each acquisition of excitation RF pulses, optimal flip angle is to maximize GM-WM CNR efficiency. The result suggests that optimal flip angle decreases rapidly from around 40 degrees to 10 degrees at the first ten echo acquisitions, decreases slowly from around 10 degrees to 6 degrees at the range from tenth to thirty-fifth echo acquisition; and then optimal flip angle suddenly backs to around 25 degrees at around fortieth echo acquisition and smoothly reduces to around 15 degrees at the range from fortieth to one hundred fiftieth echo acquisition. Herein, the varied flip angle distribution is discontinuous around the fortieth echo acquisition and continuous before or after the discontinuous k-space acquisitions.

In FIG. 5, the varied flip angle distribution is determined such that the GM-WM CNR efficiency for each k-space line acquisitions is maximized. The GM-WM-CNR efficiency is simulated using an analytic solution of Bloch equation. Additionally, variable flip angle distribution also may be determined by optimizing an objective function using an analytic solution of Bloch equation including, but not limit to, an EPG algorithm, a pseudo-steady-state algorithm, a windowed ramp function, or approximation solution of Bloch equations. In embodiments, a one-dimensional k-space pattern along the slice acquisition direction is determined by the variable flip angle distribution. In some embodiments, two-dimensional k-space pattern (e.g. along both phase encoding directions) may be determined from the variable flip angle pattern.

Figure 6B:
FIG. 6B shows an example of brain image for a healthy subject acquired by IR-GRE sequence with sub-optimal constant flip angle of 16 degrees with the isotropic resolution of 1 mm.
Figure 6A:
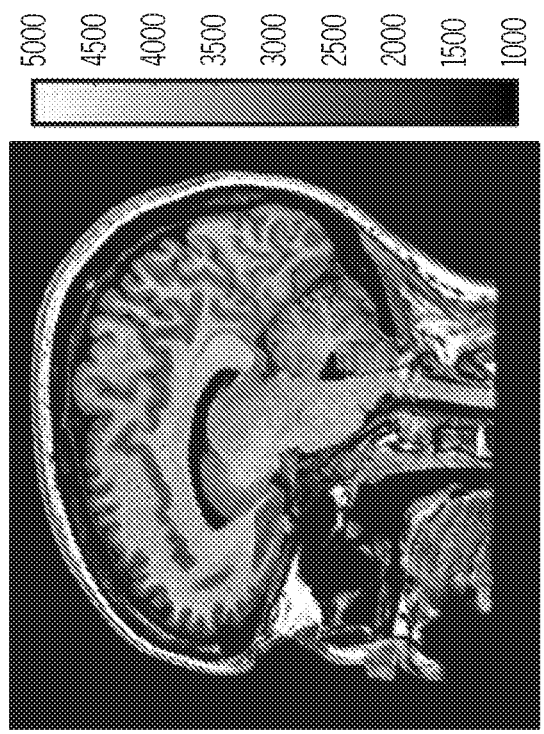
FIG. 6A shows an example of brain image for a healthy subject acquired by IR-GRE sequence with the default GE flip angle of 12 degrees with the isotropic resolution of 1 mm.

FIG. 6A shows an example of brain image for a healthy subject acquired by IR-GRE sequence with the default GE flip angle of 12 degrees with the isotropic resolution of 1 mm at 3.0 Tesla. FIG. 6B shows an example of brain image for a healthy subject acquired by IR-GRE sequence with a proposed sub-optimal constant flip angle of 16 degrees with the isotropic resolution of 1 mm at 3.0 Tesla.

The proposed sub-optimal constant flip angle is determined by the averaged optimal variable flip angles. The scan time is 269 seconds for default GE sequence and 173 seconds for proposed sub-optimal constant flip angle sequence. The SNR and its efficiency of whole brain tissue is 68.0 and 4.1 $s^{-1/2}$ in FIG. 6A, and 74.9 as well as 5.7 $s^{-1/2}$ in FIG. 6B. Even at the sub-optimal condition, the method with sub-optimal variable flip angle increases the SNR efficiency by 39%. The GM-WM CNR and its efficiency of whole brain tissue are 26.6 and 1.6 $s^{-1/2}$ in FIG. 6A, and 26.0 and 2.0 $s^{-1/2}$ in FIG. 6B. Even at the sub-optimal condition, the method with the sub-optimal variable flip angle increases the GM-WM CNR efficiency by 25%. Herein optimal variable flip angles can be selected to be constant for achieving the sub-optimal objective function in whole k-space. The results indicate that sequence with optimal variable flip angle has a potential to further improve both SNR and CNR efficiencies.

Figure 7:
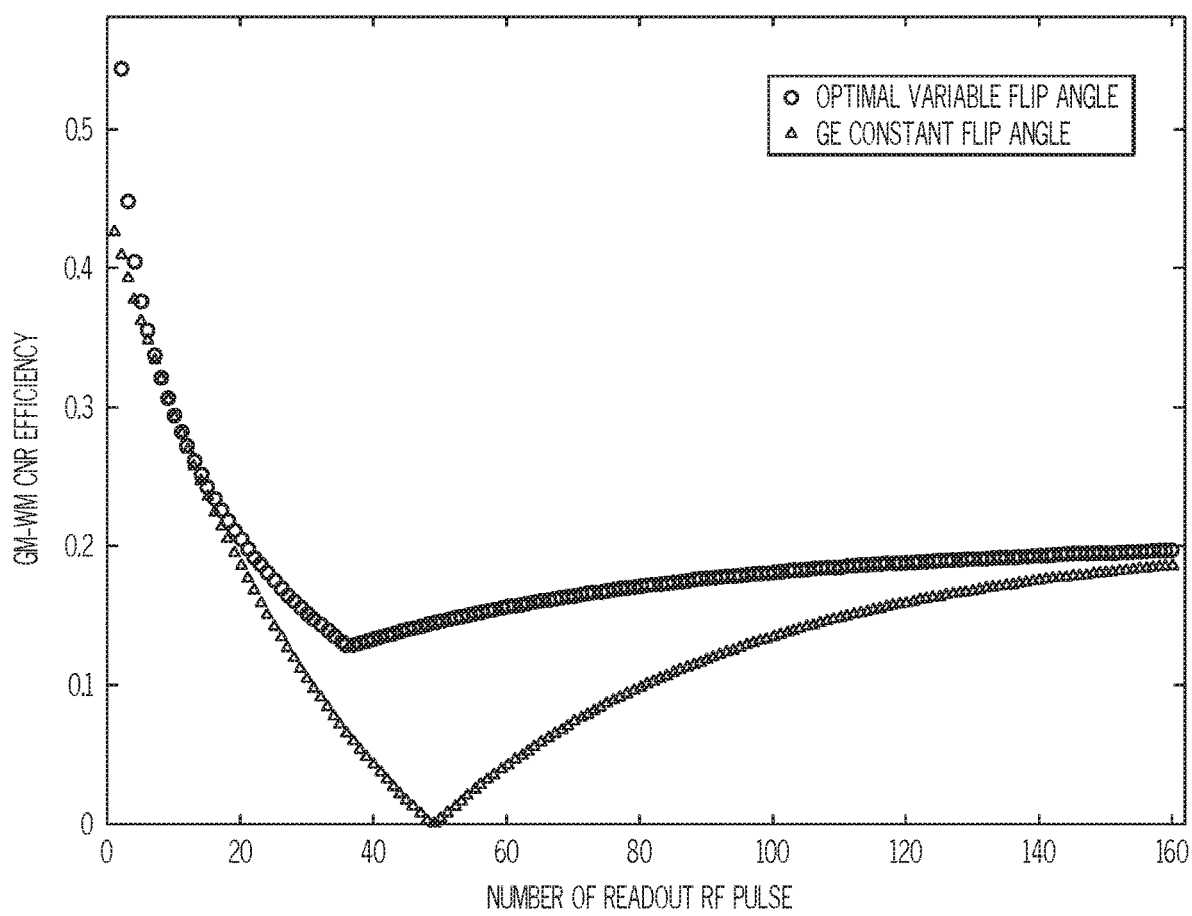
FIG. 7 is a graph illustrating theoretically predicted gray matter—white matter contrast to noise (CNR) efficiency as a function of the number of excitation radiofrequency pulses for optimal variable flip angles (circle) and GE constant flip angle (triangle) in IR-GRE sequence.

FIG. 7 is a graph illustrating theoretically predicted GM-WM CNR efficiency as a function of the number of readout excitation radiofrequency pulses for optimal variable flip angles (circle) and GE constant flip angle (triangle) of 12 degrees in IR-GRE sequence. In the first four k-space line acquisitions of transient state, GM-WM CNR efficiency of image acquired with optimal variable flip angles is higher than that acquired with the GE constant flip angle. The k-space line acquisitions from $20^{th}$ to $40^{th}$ in the transient state also show higher GM-WM CNR efficiency. Since the center portion of k-space contains low spatial frequency information that determines overall image contrast, signal intensity, and general shapes, the k-space line in transient state showing high tissue GM-WM CNR efficiency should be used to fill the center portion of k-space (e.g., the low spatial frequency k-space lines). That is, the k-space pattern fills the center of k-space (e.g. phase encoding zero line) by acquisition during the transient state. Theoretically, the image acquired with optimal variable flip angles has higher CNR efficiency and better resolution than that acquired with GE constant flip angle for whole k-space as shown in FIG. 7. That is, the image acquired with optimal variable flip angles has better image quality in both GM-WM CNR efficiency and spatial resolution.

Figure 8:
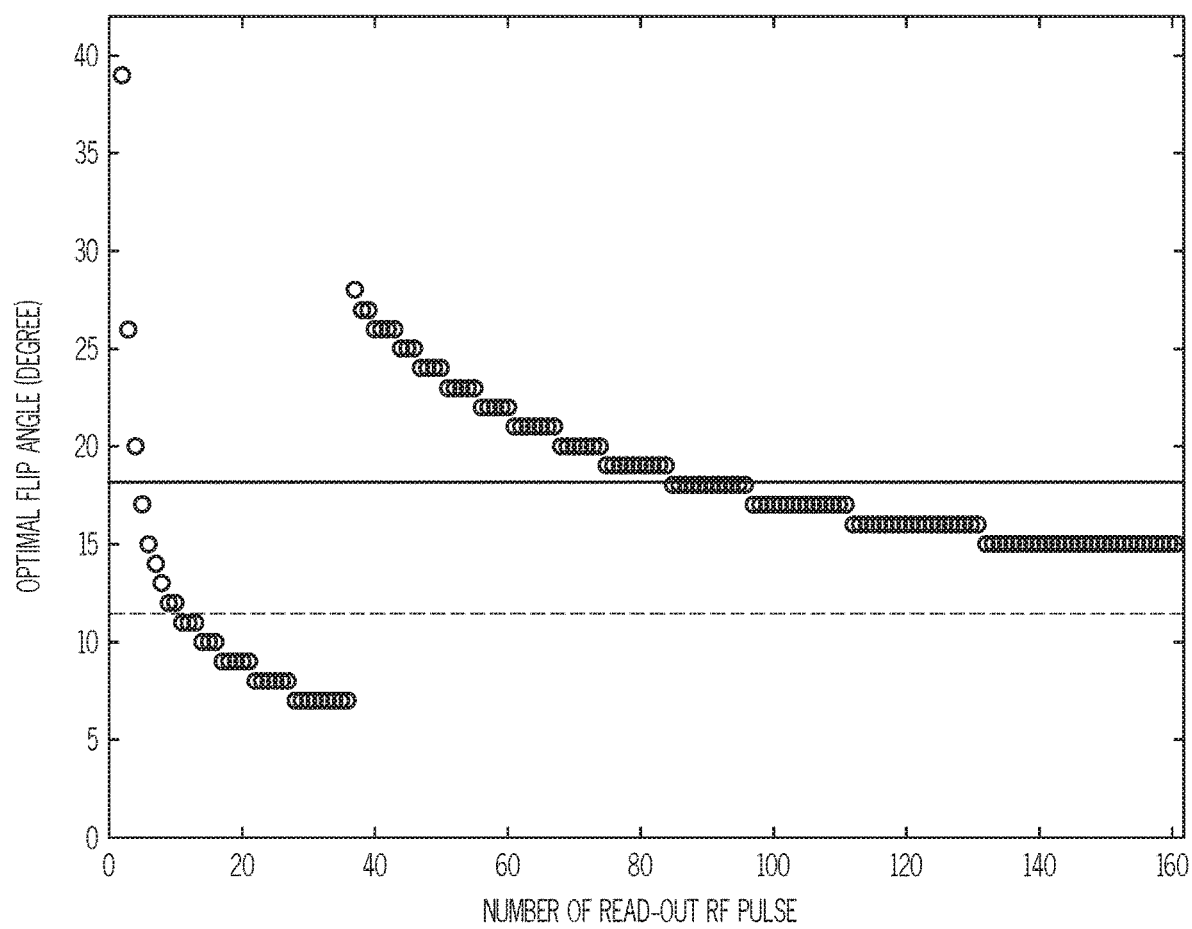
FIG. 8 is a graph illustrating an example of optimal variable flip angles distribution as a function of the number of readout excitation radiofrequency pulses to maximize brain tumor—normal tissue contrast to noise (CNR) efficiency for each excitation radiofrequency pulse in magnetization preparation rapid gradient echo sequence (IR-GRE) after contrast administration of 0.1 mmol/kg Gadavist.

With the administration of contrast agent, for example, 0.1 mmol/kg body weight Gadavist leaking into brain tumor lesion, the $T_1$ relaxation is significantly reduced to be less than 500 ms, even to 200 ms. In the simulation according to one or more embodiments of the present disclosure, the values of $T_1$, $T_2$, and proton density of contrast enhanced are assumed to be 400 ms, 200 ms and 1.0 at 3.0 Tesla, respectively. The values of $T_1$, $T_2$, and proton density of normal brain tissue can be approximated by the averages of gray matter and white matter at 3.0 Tesla, which are 1150 ms, 95 ms, and 0.70, respectively after the administration of contrast agent. The simulation results are based on following factors: (1) no Gadavist will leak into normal brain tissue; (2) blood volume of brain tissue is around 5% and the Gadavist in intra-capillary vascular will lead to the significant signal enhancement of normal brain tissue. The contribution of intra-capillary vascular to the signal of normal tissue will be ignorable because there is no leakage of contrast agent and blood volume is very smaller in normal brain tissue. The optimal variable flip angles as a function of the number of readout excitation radiofrequency pulses to maximize the enhanced tumor-brain tissue CNR efficiency for each excitation radiofrequency pulse are simulated using MATLAB programming as shown in FIG. 8. The optimal flip angles are determined across whole k-space and vary with different echo acquisitions. According to the central view k-space sampling order, by trading off the CNR efficiency (low spatial frequency k-space components) against spatial resolution (high spatial frequency k-space components), an optimal constant flip angle of 18 degrees (solid line) is selected for IR-SPGR sequence after the administration of contrast agent.

Figure 9A:
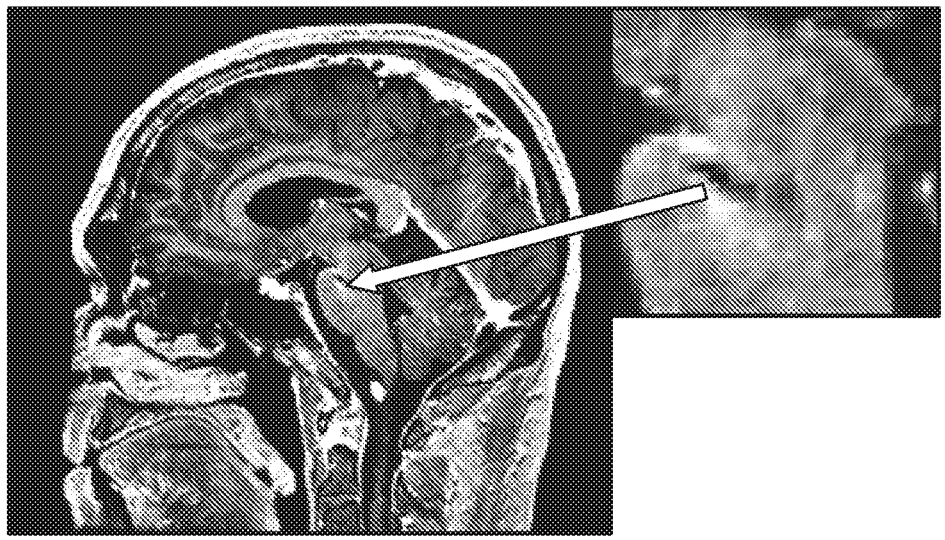
FIG. 9A shows an example of brain image for a healthy subject acquired by IR-GRE sequence with the default GE flip angle of 12 degrees with the isotropic resolution of 1 mm after contrast administration of 0.1 mmol/kg Gadavist.
Figure 9B:
FIG. 9B shows an example of brain image for a healthy subject acquired by IR-GRE sequence with sub-optimal constant flip angle of 16 degrees with the isotropic resolution of 0.7 mm after contrast administration of 0.1 mmol/kg Gadavist.

FIGS. 9A and 9B show in vivo brain images of a patient with brain tumor acquired with IR-GRE sequence with sub-optimal constant flip angle and GE default protocol after the administration of 0.1 mmol/kg Gadavist. The acquisition according to the present application (using the flip angle 18 degrees shown in FIG. 9B) is compared with GE default acquisition (using the flip angle of 12 degrees shown in FIG. 9A). As shown in FIG. 8, the flip angle of 18 degrees (solid line) is closer to the optimal flip angle than the flip angle of 12 degrees (dash line). That is, the quality of images acquired with the optimal variable flip angle according to the present disclosure is theoretically better than that of the images acquired with GE default protocol. With an in vivo comparison shown in FIG. 9, the enhancement of the lesion is more conspicuous in addition to better definition of the tumor architecture in the images acquiring using our optimized sequence in FIG. 9B as compared to the default sequence in FIG. 9A. Additionally, the enhanced tumor in the lower row shows more details than those in the upper row. Thus, this in vivo result is in good agreement with our simulation.

According to the present disclosure, MR scanning time as well as image artifacts may be reduced. Reducing the duration of an MR scan has a number of advantages. For example, as scan time is reduced, patient throughput increases. An increase in patient throughput allows more subjects to be imaged in a given period of time or support more comprehensive scans without a time penalty. Additionally, by reducing the scanning time, it is possible to reduce the likelihood of subject motion induced artifacts in the reconstructed image.

Image artifacts can easily lead to clinical misinterpretation of the MR images. In FSE imaging with long echo trains, the observed echo amplitudes typically exhibit an amplitude decay based on tissue $T_1$ and $T_2$ values. This decay may result in undesirable ringing artifacts, particularly in long echo train images. Additionally, maintaining RF power deposition (SAR) in the imaging bore during the acquisition process is critical. This is particularly critical for multi-echo acquisitions such as FSE. Several strategies are developed to address both signal amplitude decay and RF power deposition during multi-echo acquisitions.

The MR parameters are static field strength and pathophysiology dependent. It is also dependent of the properties of normal or abnormal tissues. For example, the MR parameters include, but are not limited to, $T_1$ relaxation, $T_2$ relaxation, $T_2$ star relaxation, proton density, diffusion, magnetic susceptibility, oxygen/deoxygen-hemoglobin or magnetization transfer. This disclosure contemplates that the MR parameters can include other parameters related to objective functions. It should be understood that the MR parameters could be obtained from the literature and/or estimated from experimental results.

The present invention relates to a method of obtaining one or more 2 dimensional or 3 dimensional images. The variable flip angles which are determined to optimize an objective function for each k-space line acquisition are implemented in both transient state and steady-state. Generally, magnitude of k-space line varies in the transient state and stable in steady-state. That is, magnitude of k-space line is very sensitive to imaging parameters (such as flip angles) in a transient state and is insensitive in a steady-state. Therefore, the characteristic of sequence in transient state may be used to fill the center portion of k-space for improving image quality. That is, the k-space lines acquired with variable flip angles in the transient state are used to fill low spatial frequencies. Additionally, phase encoding may be extended to a non-linear phase encoding though all example are discussed for linear phase encoding.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method for obtaining a magnetic resonance (MR) image, the method comprising:
receiving MRI parameters for a target tissue;
selecting at least one objective function from a plurality of objective functions;
simulating a relationship between each flip angle and the at least one objective function based on the MRI parameters;
determining optimal variable flip angle distribution to reach optimization of the at least one objective function for whole acquisition of the MR image;
selecting or optimizing a k-space strategy;
applying a plurality of radio frequency (RF) pulses with the optimal variable flip angle distribution and the k-space strategy to a target area in an object;
receiving MR signals from the target area, the MR signals corresponding to the plurality of RF pulses;
acquiring, in the k-space strategy, k-space lines based on the MR signals; and
reconstructing the MR image from the k-space lines.

2. The method of claim 1, wherein the objective function is at least one of signal intensity, signal-to-noise ratio (SNR), signal intensity efficiency, SNR efficiency, image resolution, total scan time, contrast, contrast-to-noise ratio (CNR), contrast efficiency, CNR efficiency, specific absorption rate (SAR) or image artifact.

3. The method of claim 2, wherein the image artifact comprises at least one of susceptibility artifact, geometry distortion, signal inhomogeneity, cross excitation, cross-talk artifact, motion, chemical shift artifact, or contrast agent leakage into healthy tissue.

4. The method of claim 1, wherein applying the plurality of RF pulses includes applying at least one of a gradient echo sequence, a spin echo sequence, a fast gradient echo sequence, a fast spin echo sequence, and their variations with or without magnetization preparation or specific tissue suppression, parallel imaging technique, under-sampling technique, or administration of contrast agent.

5. The method of claim 1, wherein:
the k-space strategy comprises at least one of a k-space sampling order, a rectilinear imaging, radial imaging, echo planar imaging, spiral imaging, projection reconstruction imaging, a random k-space trajectory, a under-sampled k-space trajectory, or a partial k-space sampling trajectory, and
the k-space sampling order comprises at least one of a sequential sampling order, a centric sampling order, an interleave sampling order, a reverse sampling order, or a random sampling order.

6. The method of claim 1, wherein the objective function is simulated using at least one of analytic solution, approximation solution, numerical solution and EPG algorithm of Bloch equations for the RF pulses and MR parameters of a tissue.

7. The method of claim 1, wherein the optimal variable flip angle distribution is determined, based on the simulated relationship, to reach the optimization of the at least one objective function.

8. The method of claim 7, wherein obtaining the optimal variable flip angle distribution further comprises:
balancing variable flip angle distribution to achieve the optimization of the at least one objective function in whole k-space including k-space low-spatial-frequency, high-spatial-frequency and mediate-spatial-frequency components;
obtaining the optimal variable flip angle distribution based on the balance of the variable flip angle distribution;
applying a plurality of radio frequency (RF) pulses with the optimal variable flip angle distribution and the optimal k-space strategies to the target area in the object;
receiving MR signals from the target area, the MR signals corresponding to the plurality of RF pulses;
acquiring, in a k-space strategy, k-space lines based on the MR signals; and
reconstructing the MR image from the k-space lines.

9. The method of claim 1, wherein the optimal variable flip angle distribution is set to a constant value.

10. The method of claim 1, wherein the plurality of RF pulses comprise at least one of excitation pulse, magnetization preparation pulses, and refocusing pulses.

11. The method of claim 1, wherein acquisition of the k-space lines comprises at least one of 2-dimensional acquisition, multi-slab or 3-dimensional acquisition.

12. A magnetic resonance imaging (MRI) system comprising:
a magnetic field generating unit configured to apply a plurality of RF pulses with a variable flip angle to a target area in the object;
a receiver configured to receive MR signals from the target area;
a processing unit;
a system memory; and
machine readable instructions stored in the system memory that, when executed by the processing unit, cause the processing unit to:
receive MRI parameters for a target tissue;
select at least one objective function from a plurality of objective functions;
simulate a relationship between each flip angle and the at least one objective function based on the MRI parameters;
determine optimal variable flip angle distribution to reach optimization of the at least one objective function for whole acquisition of an MR image;
select or optimize a k-space strategy;
apply a plurality of radio frequency (RF) pulses with the optimal variable flip angle distribution to the target area in an object;
receive MR signals from the target area, the MR signals corresponding to the plurality of RF pulses;

acquire, in the k-space strategy, k-space lines based on the MR signals; and reconstruct the MR image from the k-space lines.

13. The MRI system of claim 12, wherein the objective function is at least one of signal intensity, signal-to-noise ratio (SNR), signal intensity efficiency, SNR efficiency, image resolution, total scan time, contrast, contrast-to-noise ratio (CNR), contrast efficiency, CNR efficiency, specific absorption rate (SAR) or image artifact.

14. The MRI system of claim 13, wherein the image artifact comprises at least one of susceptibility artifact, geometry distortion, signal inhomogeneity, cross excitation, cross-talk artifact, motion, chemical shift artifact, or contrast agent leakage into healthy tissue.

15. The MRI system of claim 12, wherein:

the k-space strategy comprises at least one of a k-space sampling order, a rectilinear imaging, radial imaging, echo planar imaging, spiral imaging, projection reconstruction imaging, a random k-space trajectory, a under-sampled k-space trajectory, or a partial k-space sampling trajectory, and the k-space sampling order comprises at least one of a sequential sampling order, a centric sampling order, an interleave sampling order, a reverse sampling order, or a random sampling order.

16. The MRI system of claim 12, wherein the objective function is simulated using at least one of analytic solution, approximation solution, numerical solution, and EPG algorithm of Bloch equations for the RF pulses and MR parameters of a tissue.

17. The MRI system of claim 12, wherein the optimal variable flip angle distribution is determined based on the simulated relationship to reach the optimization of the at least one objective function.

18. The MRI system of claim 12, wherein the machine readable instructions stored in the system memory, when executed by the processing unit, cause the processing unit to:

balance variable flip angle distribution to achieve the optimization of the at least one objective function in whole k-space including k-space low-spatial-frequency, high-spatial-frequency and mediate-spatial-frequency components;

obtain the optimal variable flip angle distribution based on the balance;

apply a plurality of radio frequency (RF) pulses with the optimal variable flip angle distribution and the optimal k-space strategies to the target area in the object;

receive MR signals from the target area, the MR signals corresponding to the plurality of RF pulses;

acquire, in a k-space strategy, k-space lines based on the MR signals; and reconstruct the MR image from the k-space lines.

19. The MRI system of claim 12, wherein the plurality of RF pulses comprise at least one of excitation pulse, magnetization preparation pulses, and refocusing pulses.

20. The MRI system of claim 12, wherein the magnetic field generating unit configured to apply at least one of a gradient echo sequence, a spin echo sequence, a fast gradient echo sequence, a fast spin echo sequence, and their variations with or without magnetization preparation or specific tissue suppression, parallel imaging technique, under-sampling technique, or administration of contrast agent.

\* \* \* \* \*